BLOCKING OSCILLATOR EMPLOYING NON-SATURATING
GROUNDED BASE TRANSISTOR
Filed April 9, 1963
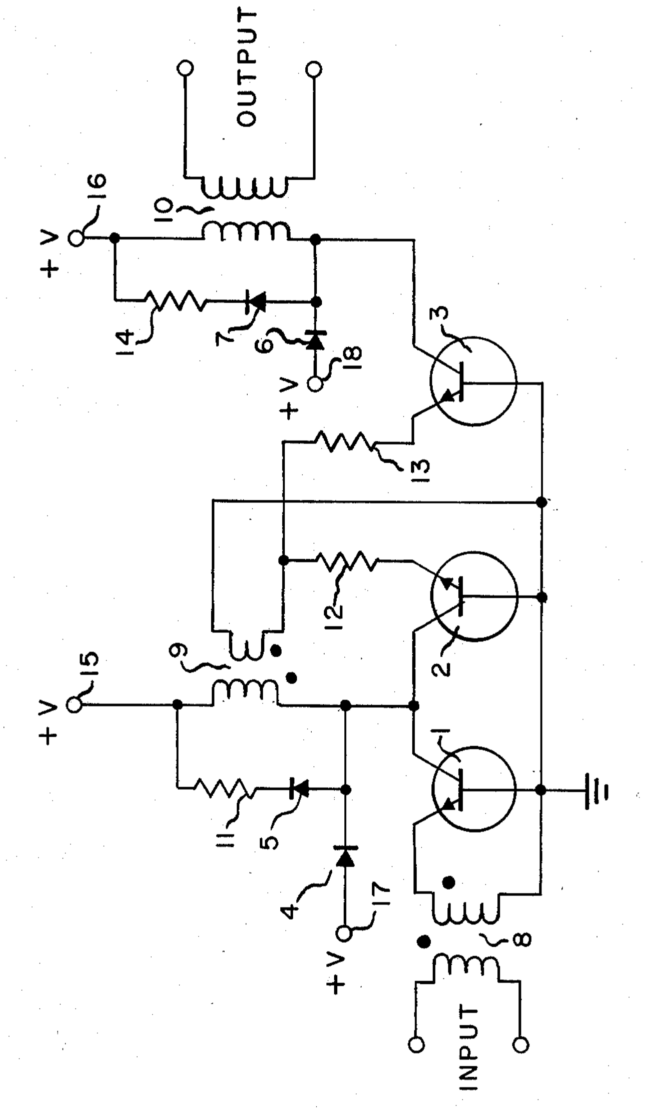
Alan V. White
INVENTOR
BY
ATTORNEY United States Patent Office 3,204,126

Patented Aug. 31, 1965

3,204,126

BLOCKING OSCILLATOR EMPLOYING NON-SATURATING GROUNDED BASE TRANSISTOR

Alan V. White, Houston, Tex., assignor to Texas Instruments Incorporated, Dallas, Tex., a corporation of Delaware Filed Apr. 9, 1963, Ser. No. 271,678
14 Claims. (Cl. 307—88.5)

The invention relates to a pulse generator circuit and more particularly to a pulse generator circuit utilizing a blocking oscillator which is responsive to a trigger.

A principal object of the invention is a pulse generating circuit capable of operating at high duty cycles and accepting triggers at high repetition rates.

Another object of the invention is a pulse generating circuit having a fast response time for generating a pulse having a fast rise time and short pulse-width.

Still another object of the invention is a pulse generating circuit responsive to and compatible with current-mode switching for producing timing functions in high speed digital computers.

One feature of the invention is a transistor blocking oscillator having a novel combination of means therein for hastening the recovery time of the blocking oscillator and making it quickly ready to receive another trigger.

Aother feature of the invention is the above transistor blocking oscillator having means therein for maintaining the transistor in its unsaturated condition thereby operating the transistor under its fastest switching conditions.

Still another feature of the invention is the above transistor blocking oscillator in combination with a current-mode trigger circuit for proper loading of the blocking oscillator.

The foregoing and other objects, features and advantages of the invention will be apparent from the following detailed description taken in connection with the appended claims and attached drawing in which:

The one figure illustrates one circuit embodiment of the invention.

The invention relates generally to a pulse generating circuit which includes a blocking oscillator having a transistor of the grounded-base configuration and a transformer therein interconnected so that the transformer applies a trigger to the transistor and the transistor in response thereto applies a positive feedback to the transformer. The current in the transformer primary, because of the transistor loading and the positive feedback, increases linearly and quickly reaches a maximum whereat the voltage across the transformer secondary drops to zero, cutting off the transistor. The transformer primary and the collector-base circuit of the transistor are connected in such a manner that, when the transistor is cut off, the back E.M.F. developed in the transformer is discharged through the inter-electrode capacitance of the collector-base circuit causing a backswing. This arrangement permits a high backswing and thereby reduces the recovery time constant of the transformer. Additionally, means are connected across the transformer primary for damping the backswing to be within the voltage rating of the transistor while still permitting the backswing to be high. Furthermore, in order to operate the transistor under its fastest switching conditions, means are connected thereto to maintain the transistor in its unsaturated condition. In order to ensure that the input trigger circuit for the blocking oscillator does not load the oscillator and hinder its operation and in order to provide current-mode switching, a grounded-base transistor switch is connected to the transformer primary for application of the trigger thereto. The collector-base circuit of the switch is related to the transformer primary in the same manner that the collector-base circuit of the transistor in the blocking oscillator is related to the transformer primary, thereby properly loading and facilitating the operation of the blocking oscillator.

Referring now to the drawing, the blocking oscillator includes grounded-base transistor 2, and transformer 9 wherein the transformer 9 primary is connected between the positive potential at terminal 15 and the collector of transistor 2, and wherein the transformer 9 secondary is connected to the base of transistor 2 and to the emitter of transistor 2 through resistor 12. Resistor 11 and diode 5 are shunted across the primary of transformer 9 in order to damp and set the level of the backswing. A positive potential at terminal 17 connected through diode 4 to the collector of transistor 2 functions to maintain transistor 2 in its unsaturated condition.

The operation of the above blocking oscillator is as follows:

Transistor 2 is normally in its high impedance condition or off. Assume that a trigger potential slightly above ground but less than the potential at terminal 15 is applied to the collector of transistor 2 at time zero. At this instant, there is a slight current in the primary of transformer 9 due to the transformer losses and the loading of the secondary. At time zero, therefore, the current in the primary is small and thereafter begins to rise at a constant rate until it reaches a maximum. This current rises at a constant rate because the voltage across the primary of transformer 9 appears to be constant. This is so since the voltage across the transformer secondary goes to a maximum at time zero and turns transistor 2 on which maintains said trigger potential at its collector. Transistor 2 is turned on by the voltage pulse at the secondary of transformer 9, thereby applying a positive feedback to the transformer primary through its collector. In consequence of transistor 2 turning on, the potential across the transformer primary appears constant until transistor 2 turns off. Summarizing briefly, at time zero, there is an immediate slight current in the transformer primary causing a voltage pulse in the transformer secondary which turns transistor 2 on. Thereafter, the transformer primary current goes towards a maximum at a fast linear rate, whereby the transformer secondary voltage remains constant keeping transistor 2 on. When the current in the transformer primary reaches its maximum, its rate of change is zero which drops the secondary voltage to zero, turning transistor 2 off.

The rate of rise of the primary current is substantially determined by the voltage across the primary divided by the inductance of the primary. The maximum value the primary current reaches is determined by the voltage across the primary, the turns ratio of the transformer, the resistor 12, and the emitter-collector circuit of transistor 2.

Assuming now that the secondary voltage of transformer 9 has dropped to zero and transistor 2 turns off, the back E.M.F. developed in the transformer 9 is allowed to discharge through a transient A.C. circuit path including terminal 15, the primary of transformer 9, the collector-to-base circuit of transistor 2 to ground. The inter-electrode capacitance of the collector-to-base circuit of transistor 2 provides a high impedance for the transient backswing in order to rapidly discharge the energy stored in the transformer. In order to ensure that the backswing voltage is not too high since it might damage transistor 2, diode 5 and resistor 11 are shunted across the transformer primary to set the backswing voltage to be compatible with the voltage rating of transistor 2. For example, if the voltage at the collector of transistor 2 becomes too high with respect to the voltage at terminal 15, then diode 5 is forward biased thereby requiring the backswing current to bypass transistor 2 through diode 5.

In order to prevent the transistor 2 from going into its saturated condition when it is on, a positive voltage source at terminal 17 is connected to the collector of transistor 2 through diode 4. Assuming that transistor 2 tends toward saturation, this means that the potential at the collector of transistor 2 falls to a value whereat the value only decreases slightly in response to increases in forward bias potential applied to the base. Therefore, when the potential at the collector of transistor 2 falls to a predetermined value which value is above the saturation point, diode 4 is forward biased and the potential at the collector of transistor 2 is clamped to the voltage value of the source at terminal 17 thereby maintaining transistor 2 in its unsaturated condition.

The means for applying an input trigger to the primary of transformer 9 includes transformer 8 and grounded-base transistor 1. The input trigger is applied to the primary of transformer 8 and a differentiated trigger pulse is applied between the emitter and base of transistor 1 by the secondary of transformer 8. The transformer 8 differentiates the input pulse since its windings are chosen to have a low inductance. When the secondary of transformer 8 applies the trigger input to the emitter-base circuit of transistor 1, it is turned on. The trigger applied to the primary of transformer 8 is of such a value that it causes the emitter of transistor 1 to become more negative than the base of transistor 1 thereby turning the transistor on. When transistor 1 is turned on, said aforementioned slight current flows over the circuit path including terminal 15, transformer 9 primary, and the collector-emitter circuit of transistor 1 to ground. At this time, the voltage induced in the secondary of transformer 9 turns transistor 2 on. After a short time, the transistor 1 turns off while transistor 2 remains on thereby allowing the current in the primary of transformer 9 to continue to linearly increase to a maximum value. With transistor 1 off and transistor 2 on, the current flows over the path including terminal 15, transformer 9 primary, collector-emitter circuit of transistor 2, resistor 12, and the transformer 9 secondary to ground. This current increases linearly and therefore, the voltage across the transformer 9 secondary is constant until the primary current reaches a maximum whereat the secondary voltage becomes zero. Therefore, when transistor 1 is triggered, the voltage at the junction of resistor 12 and the transformer 9 secondary becomes negative with respect to ground for the time period substantially starting at the time transistor 1 is triggered on until the current in the transformer 9 primary reaches is maximum value.

The output pulse from the blocking oscillator is derived from the junction between resistor 12 and the secondary of transformer 9. This junction is connected to the emitter of transistor 3 through resistor 13, the base of transistor 3 being connected to ground. The collector of transistor 3 is connected to an output transformer 10, whereby the output pulse is derived from the transformer 10 secondary. The transistor 3 is maintained in an unsaturated condition by the voltage source at terminal 18 connected to the collector of transistor 3 through diode 6 in the same manner that transistor 2 is maintained in its unsaturated condition by the voltage source at terminal 17 connected to the collector of transistor 2 by diode 4. Also, the diode 7 and resistor 14 shunted across the primary of transformer 10 damp the backswing produced by the back E.M.F. developed in transformer 10 in the same manner that diode 5 and resistor 11 damp the backswing of the back E.M.F. developed in transformer 9 while the interelectrode capacitance of the collector-base circuit of transistor 3 permits a high backswing.

The constant negative potential produced at the junction of resistor 12 and the transformer 9 secondary when transistor 1 is triggered on turns transistor 3 on for the time period of said negative potential. The instant transistor 3 is turned on, a slight current flows in the transformer 10 primary over the circuit path including terminal 16, transformer 10 primary, the collector-emitter circuit of transistor 3, and the transformer 9 secondary to ground. Thereafter, the current in transformer 10 primary increases linearly causing a constant voltage pulse output at the transformer 10 secondary. The time period of the output pulse is substantially the same as the time period of the negative potential at the junction of resistor 12 and the transformer 9 secondary since transistor 3 is cut off when transistor 2 turns off.

It should be pointed out that transistor 1 is maintained in its unsaturated condition by the same circuitry that maintains transistor 2 in its unsaturated condition, namely, 'he voltage source at terminal 17 and diode 4 connected 'o the collector of transistor 1.

The invention has been described herein with reference to the drawing, wherein N-P-N transistors are illustrated. However, the invention may be constructed utilizing P-N-P transistors as is well-known by those skilled in the art.

It is to be understood that the above-described embodiment is merely illustrative of the invention. Numerous other arrangements may be devised by those skilled in the art without departing from the spirit and scope of the invention as defined by the appended claims.

What is claimed is:

1. A blocking oscillator comprising a grounded-base transistor having at least base, emitter and collector electrodes, a transformer having primary and secondary windings, a potential source, means serially connecting said potential source, said primary winding and said collector electrode, resistance means, means serially connecting said base electrode, said secondary winding, said resistance means and said emitter electrode, said transistor being normally in one state of conduction, means for applying a trigger to said primary winding for switching said transistor into an opposite state of conduction, and means for deriving an output from the junction between said secondary winding and said resistance means.

2. The blocking oscillator of claim 1, wherein the back E.M.F. developed in said transformer, when said transistor reverts back to its normal state of conduction after it has been switched to its opposite state of conduction, discharges through the serial circuit path including said potential source, said primary winding, and the collector-to-base circuit of said transistor to ground, and further including means connected across said primary winding for limiting the magnitude of said discharge through said collector-to-base circuit.

3. The blocking oscillator of claim 2, wherein said means connected across said primary winding includes an asymmetrically conducting device poled in the same direction as the base-to-collector of said transistor.

4. The blocking oscillator of claim 3, including means connected to said transistor for maintaining said transistor in an unsaturated condition.

5. The blocking oscillator of claim 4, wherein said last-mentioned means includes an asymmetrically conducting means connected to said collector electrode and poled in a direction opposite to that of said base-to-collector of said transistor.

6. The blocking oscillator of claim 5, wherein said transistor is normally off and wherein said transistor switches on when a trigger is applied to said primary winding.

7. The blocking oscillator of claim 6, wherein said means for applying a trigger to said primary winding includes a grounded-base transistor switch having at least collector, emitter and base electrodes, the collector electrode of said transistor switch being connected to the collector electrode of said transistor, and means for applying the trigger potential to the emitter-base circuit of said transistor switch.

8. The blocking oscillator of claim 7, wherein said means for deriving an output from the junction between said secondary winding and said resistance means includes a grounded-base transistor having its emitter electrode connected to said junction through a resistance means.

9. The blocking oscillator of claim 8, wherein said last-mentioned transistor and said transistor switch are normally off.

10. The blocking oscillator of claim 1, wherein said means for applying a trigger to said primary winding includes a grounded-base transistor switch having at least collector, emitter and base electrodes, the collector electrode of said transistor switch being connected to the collector electrode of said transistor, and means for applying the trigger potential to the emitter-base circuit of said transistor switch.

11. The blocking oscillator of claim 10, including means for maintaining said transistor and said transistor switch in an unsaturated condition.

12. The blocking oscillator of claim 11, wherein said maintaining means includes an asymmetrically conducting means connected to said collector electrode and poled in a direction opposite to that of the base-to-collector of said transistor and said transistor switch.

13. The blocking oscillator of claim 1, including means connected to said transistor for maintaining said transistor in an unsaturated condition.

14. The blocking oscillator of claim 13, wherein said last-mentioned means includes an asymmetrically conducting means connected to said collector electrode and poled in a direction opposite to that of said base-to-collector of said transistor.

References Cited by the Examiner

UNITED STATES PATENTS

| | | | |
|---|---|---|---|
| 2,964,651 | 12/60 | Thomas | 307—88.5 |
| 3,021,438 | 2/62 | Moore et al. | 331—112 X |
| 3,120,615 | 2/64 | Sheehan | 307—88.5 |

ARTHUR GAUSS, *Primary Examiner.*